(12) United States Patent
Chow et al.

(10) Patent No.: US 10,355,608 B2
(45) Date of Patent: Jul. 16, 2019

(54) POWER CONVERTER MODULE

(71) Applicant: Chicony Power Technology Co., Ltd., New Taipei (TW)

(72) Inventors: Wing-Kai Chow, New Taipei (TW); Li-Yung Fu, New Taipei (TW); Chung-Hang Lai, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/836,896

(22) Filed: Dec. 10, 2017

(65) Prior Publication Data
US 2019/0089259 A1    Mar. 21, 2019

(30) Foreign Application Priority Data
Sep. 19, 2017    (CN) .......................... 2017 1 0846365

(51) Int. Cl.
*H02M 3/335*    (2006.01)
*H01F 27/24*    (2006.01)
*H05K 7/20*    (2006.01)

(52) U.S. Cl.
CPC ........ *H02M 3/33569* (2013.01); *H01F 27/24* (2013.01); *H05K 7/209* (2013.01)

(58) Field of Classification Search
None
See application file for complete search history.

(56) References Cited

U.S. PATENT DOCUMENTS

| | | | |
|---|---|---|---|
| 5,631,822 A | 5/1997 | Silberkleit et al. | |
| 5,726,615 A | 3/1998 | Bloom | |
| 7,289,329 B2 | 10/2007 | Chen et al. | |
| 9,570,535 B2 | 2/2017 | Ouyang et al. | |
| 2009/0196073 A1 | 8/2009 | Nakahori | |
| 2009/0309684 A1* | 12/2009 | Tsai | ..................... H01F 27/2866 336/105 |
| 2016/0126849 A1* | 5/2016 | Pietrantonio | ..... H02M 3/33546 363/21.04 |

FOREIGN PATENT DOCUMENTS

| CN | 102360808 A | 2/2012 |
|---|---|---|
| CN | 102360787 B | 4/2013 |

(Continued)

*Primary Examiner* — Alex Torres-Rivera
*Assistant Examiner* — Henry E Lee, III
(74) *Attorney, Agent, or Firm* — CKC & Partners Co., LLC

(57) ABSTRACT

A power converter module includes a carrier board, a transformer, and an inductor. A converter and a rectifying unit are arranged on the carrier board. The transformer includes a primary winding portion and a secondary winding portion. The primary winding portion is arranged on first side of the carrier board and coupled to an output terminal of the converter. The secondary winding portion is arranged between the first side and the primary winding portion and coupled to the rectifying unit. The inductor includes an input portion and an output portion. The input portion is arranged on the first side and coupled to the rectifying unit. The secondary winding portion is implemented with a conductive plate, and the input portion and the conductive plate are integrally formed. The output portion is coupled to the input portion and arranged on the first side or a second side of the carrier board.

18 Claims, 15 Drawing Sheets

(56) References Cited

FOREIGN PATENT DOCUMENTS

| | | |
|---|---|---|
| CN | 103748776 A | 4/2014 |
| CN | 103782355 A | 5/2014 |
| TW | 201239921 A | 10/2012 |
| TW | I456379 B | 10/2014 |
| TW | I493841 B | 7/2015 |
| TW | I543501 B | 7/2016 |
| TW | 201631874 A | 9/2016 |
| TW | M531691 U | 11/2016 |

* cited by examiner

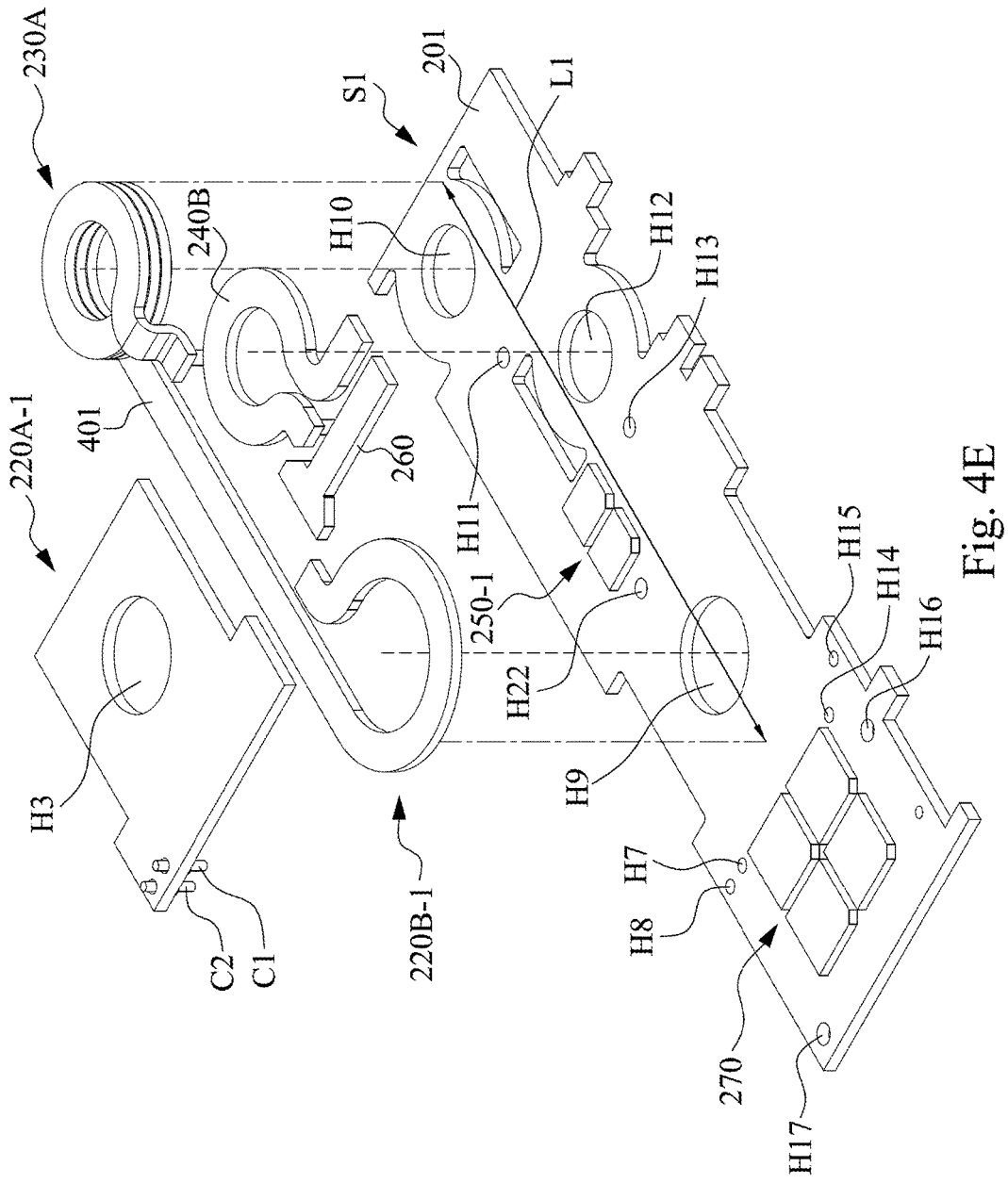

POWER CONVERTER MODULE

RELATED APPLICATIONS

This application claims priority to China Application Serial Number, 201710846365.X, filed Sep. 19, 2017, which is herein incorporated by reference.

BACKGROUND

Technical Field

The present disclosure relates to a power converter module. More particularly, the present disclosure relates to a power converter module having integrally formed windings and inductors.

Description of Related Art

A transformer and circuit components (e.g., inductors) of a common power converter are independently arranged on a circuit board, and electrical connections between these elements are formed by conductive wires on the circuit board. However, this arrangement takes up more area of the circuit board, and thus the size of the power converter is not able to be reduced.

SUMMARY

Some aspects of the present disclosure are to provide a power converter module that includes a carrier board, a transformer, and a first inductor. The carrier board includes a converter and a first rectifying unit arranged thereon. The transformer includes a first primary winding portion and a first secondary winding portion. The first primary winding portion is arranged on a first side of the carrier board and coupled to a first output terminal of the converter. The first secondary winding portion is arranged between the first side and the first primary winding portion and coupled to the first rectifying unit. The first inductor includes a first inductor input portion and a first inductor output portion. The first inductor input portion is arranged on the first side and coupled to the first rectifying unit, in which the first secondary winding portion is implemented with a first conductive plate, and the first inductor input portion and the first conductive plate are integrally formed. The first inductor output portion is coupled to the first inductor input portion and arranged on the first side of the carrier board or arranged corresponding to the first inductor input portion and on a second side of the carrier board.

As described above, the power converter module provided in the present disclosure is able to integrate windings of the transformer and the inductor by using an integrally formed conductive plate. Furthermore, with the asymmetric arrangement in lengths, more components are able to be integrated on two sides of the carrier board.

BRIEF DESCRIPTION OF THE DRAWINGS

Aspects of the present disclosure are best understood from the following detailed description when read with the accompanying figures.

FIG. 4A to FIG. 4K are schematic diagrams illustrating a progress of assembling the power converter module of FIG. 2A and FIG. 2B, according to some embodiments of the present disclosure.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

The terms used in this specification generally have their ordinary meanings in the art, within the context, and in the specific context where each term is used. The use of examples anywhere in this specification including examples of any terms discussed herein is illustrative only, and in no way limits the scope and meaning of the present disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1:
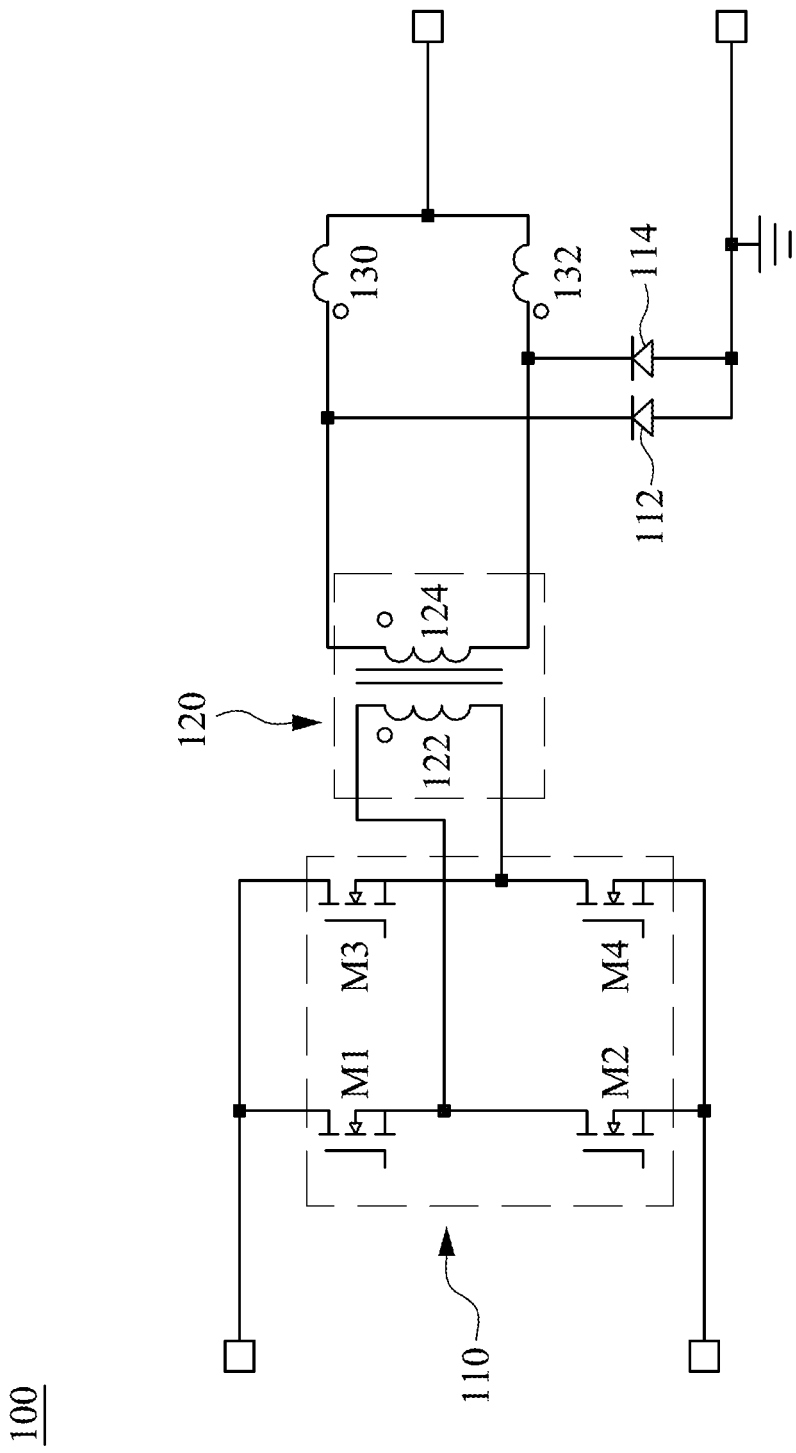
FIG. 1 is a circuit diagram of a power converter module, according to some embodiments of the present disclosure.

Reference is now made to FIG. 1. FIG. 1 is a circuit diagram of a power converter module 100, according to some embodiments of the present disclosure.

As shown in FIG. 1, the power converter module 100 includes a converter 110, a transformer 120, inductors 130 and 132, and rectifying units 112 and 114. Output terminals of the converter 110 are coupled to the transformer 120. In some embodiments, the converter 110 includes switches M1-M4. The switches M1-M4 form a full-bridge circuit.

The transformer 120 includes a primary winding 122 and a secondary winding 124. The primary winding 122 is coupled to the output terminals of the converter 110 and the secondary winding 124. The inductor 130 and the rectifying unit 112 are coupled to an output terminal of the secondary winding 124, and the inductor 132 and the rectifying unit 114 are coupled to another output terminal of the secondary winding 124. In some embodiments, the inductors 130 and 132 are output chokes.

Figure 2A:
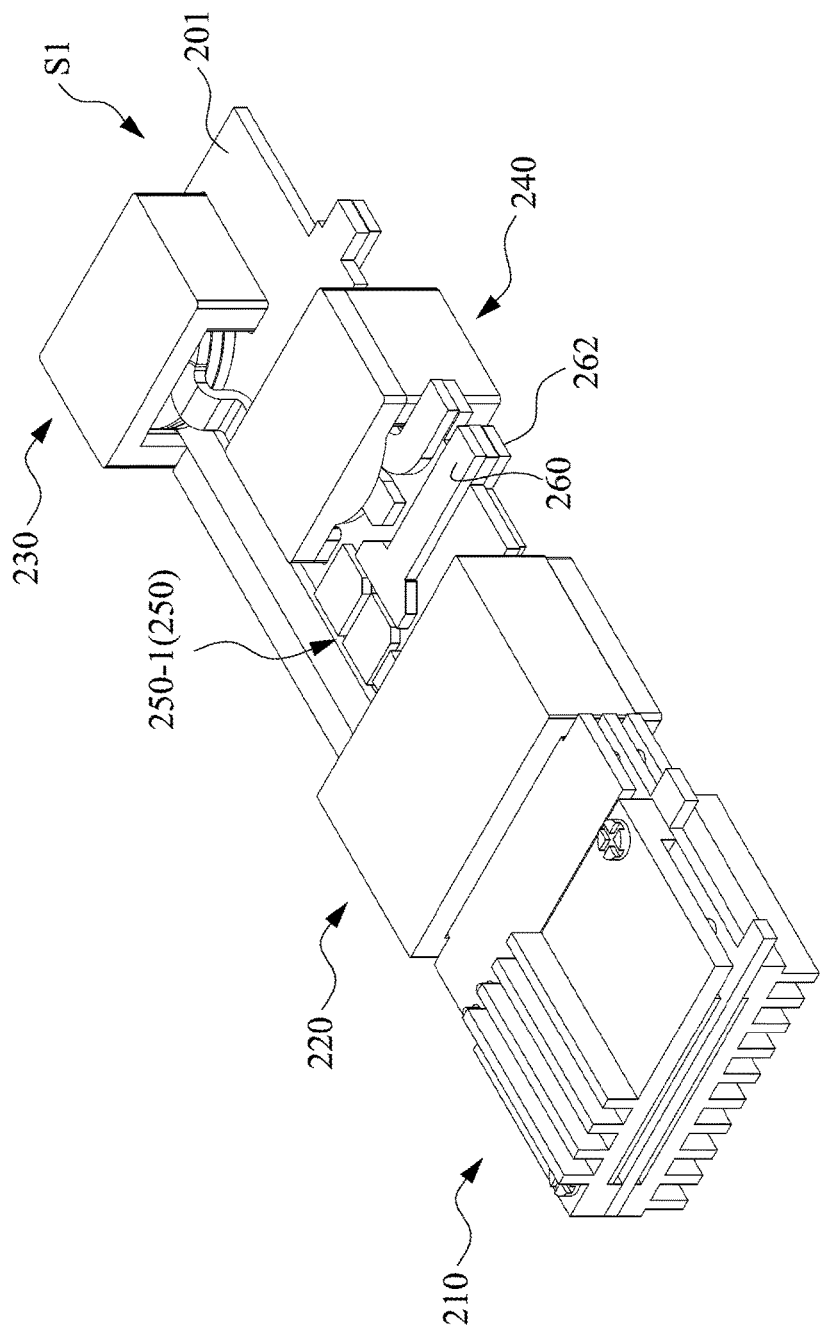
FIG. 2A is a schematic diagram illustrating a first side of the power converter module, according to some embodiments of the present disclosure.
Figure 2B:
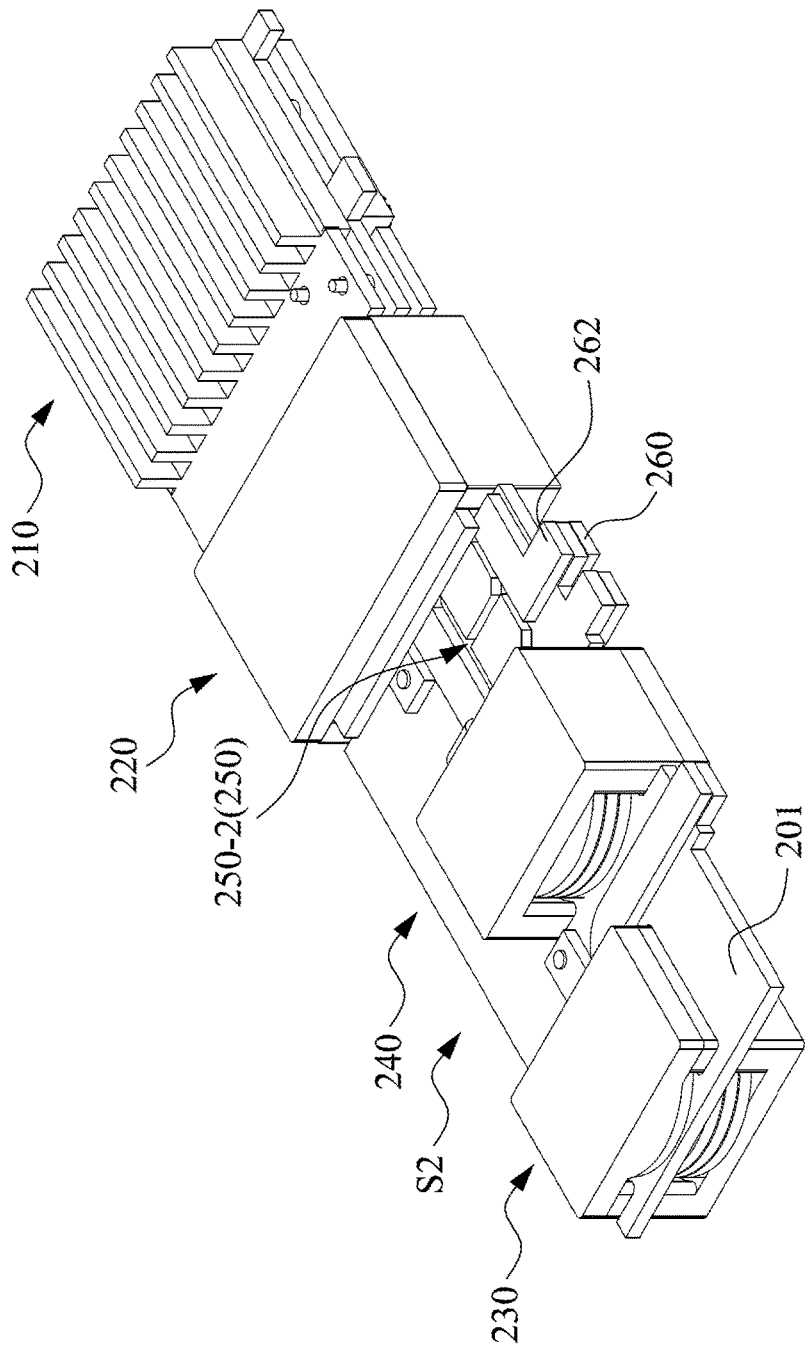
FIG. 2B is a schematic diagram illustrating a second side of the power converter module, according to some embodiments of the present disclosure.

Reference is now made to FIG. 2A and FIG. 2B. FIG. 2A is a schematic diagram illustrating a first side S1 of the power converter module 100, according to some embodiments of the present disclosure. FIG. 2B is a schematic diagram illustrating a second side S2 of the power converter module 100, according to some embodiments of the present disclosure.

As shown in FIG. 2A and FIG. 2B, the power converter module 100 includes a carrier board 201, a heat radiator 210, a transformer 220, an inductor 230, an inductor 240, a rectifier circuit 250, and conductive sheet 260 and 262.

In some embodiments, the carrier board 201 is implemented with a circuit board (e.g., a printed circuit board). In some embodiments, conductive paths (not shown), which are implemented with conductive materials, are formed on the carrier board 201. These conductive paths are arranged to provide connections between various components, in order to from the power converter module 100 in FIG. 1. In some embodiments, the conductive materials include copper, but the present disclosure is not limited thereto.

As shown in FIG. 2A, a portion of the heat radiator 210, a portion of the transformer 220, a portion of the inductor 230, a portion of the inductor 240, a portion of the rectifier circuit 250 (which is referred as "rectifying unit 250-1" hereinafter), and the conductive sheet 260 are arranged on the first side S1 of the carrier board 201.

As shown in FIG. 2B, another portion of the heat radiator 210, another portion of the transformer 220, another portion of the inductor 230, another portion of the inductor 240, another portion of the rectifier circuit 250 (which is referred as "rectifying unit 250-2" hereinafter), and the conductive sheet 262 are arranged on the second side S2 of the carrier board 201. The second side S2 of the carrier board 201 in FIG. 2B is an opposite side of the first side S1 of the carrier board 201 in FIG. 2A.

In various embodiments, the heat radiator 210 is arranged corresponding to the converter 110 of FIG. 1. For example, as described below, components corresponding to the converter 110 (e.g., converter 270 shown in FIG. 4E) are disposed between two portions of the heat radiator 210. With the heat radiator 210, dissipation of the heat generated from operations of the converter 110 is able to be accelerated.

In the FIG. 2A and FIG. 2B, the transformer 220 corresponds to the transformer 120 of FIG. 1. The inductor 230 corresponds to the inductor 130 of FIG. 1. The inductor 240 corresponds to the inductor 132 of FIG. 1. The rectifier circuit 250 corresponds to the rectifying units 112 and 114 of FIG. 1. The conductive sheets 260 and 262 are arranged on the first side S1 and the second side S2 of the carrier board 201, respectively, and are coupled to the rectifier circuit 250.

Figure 3:
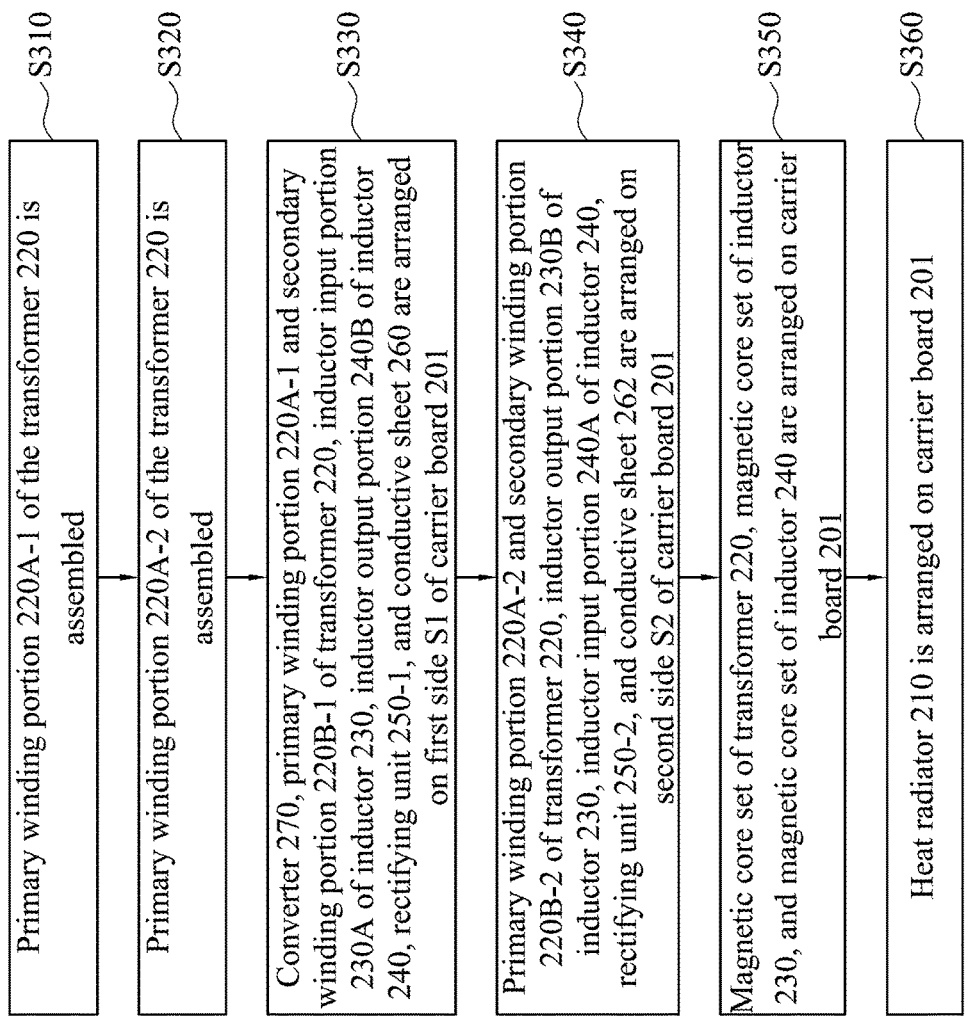
FIG. 3 is a flowchart of an assembly method, according to some embodiments of the present disclosure.

FIG. 3 is a flowchart of an assembly method 300, according to some embodiments of the present disclosure. FIG. 4A to FIG. 4K are schematic diagrams illustrating a progress of assembling the power converter module 100 of FIG. 2A and FIG. 2B, according to some embodiments of the present disclosure. For ease of understanding, the assembly method 300 of FIG. 3 will be described with reference to FIG. 4A to FIG. 4K.

In operation S310, a primary winding portion 220A-1 of the transformer 220 is assembled.

Figure 4A:
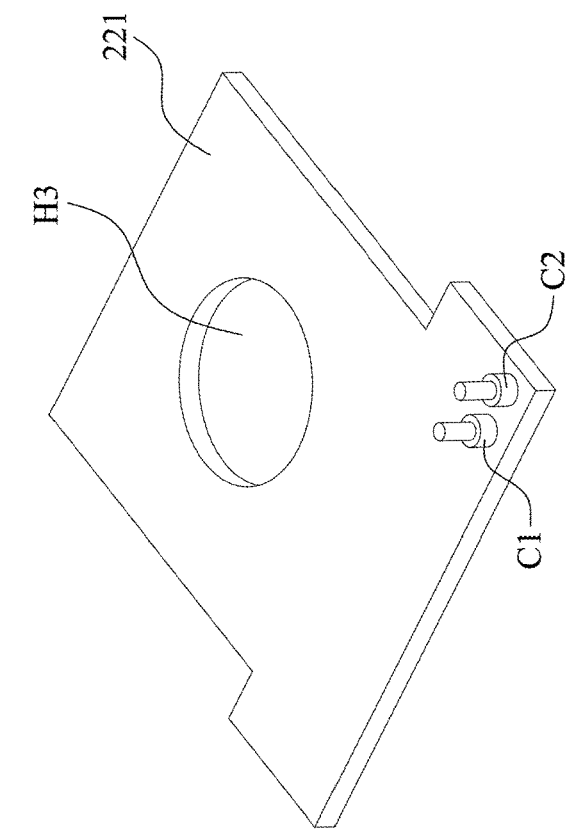
Figure 4B:
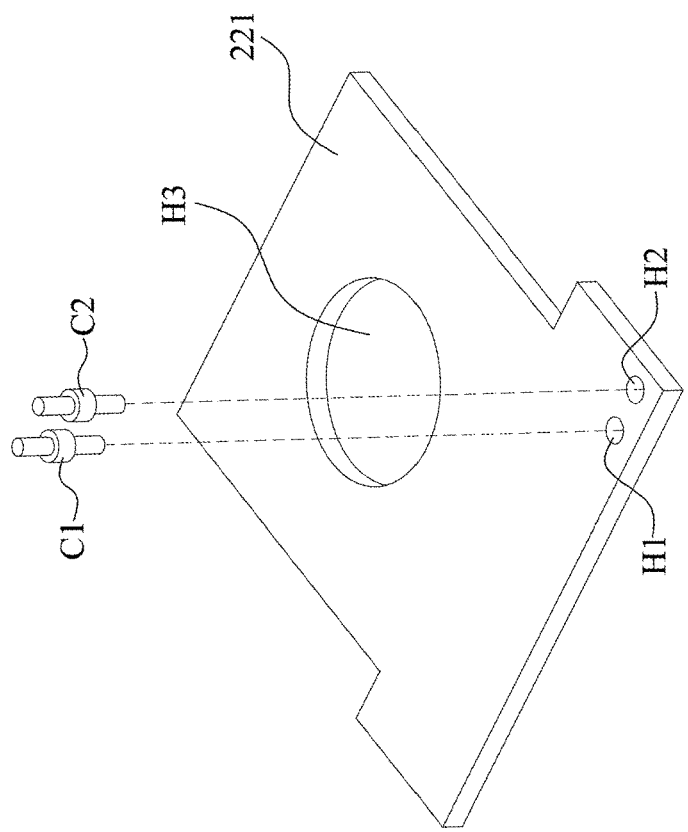

For illustration, as shown in FIG. 4A, the primary winding portion 220A-1 includes a carrier board 221 and conductive pillars C1-C2. The carrier board 221 includes through-holes H1-H3 arranged thereon. The conductive pillars C1-C2 are arranged in the through-holes H1-H2 respectively. The assembled primary winding portion 220A-1 is shown in FIG. 4B. In some embodiments, the conductive pillars C1-C2 are implemented with conductive materials, which include, for example, copper, and are fixed on the carrier board 221 by a reflow process. In some embodiments, the carrier board 221 is implemented with a printed circuit board. In the following descriptions, the through-holes and one or more components that are coupled to the through-holes are able to be fixed and connected by the reflow process, and thus the repetitious descriptions are not further given hereafter.

In some embodiments, one or more planar windings (not shown) are arranged on the carrier board 221. In some embodiments, the one or more planar windings of the carrier board 221 are formed with wires printed on the carrier board 221. In some embodiments, the one or more planar windings encircle the through-hole H3 and are coupled to the conductive pillars C1-C2, in order to form a portion of the primary winding 122 in FIG. 1.

With continued reference to FIG. 3, in operation S320, a primary winding portion 220A-2 of the transformer 220 is assembled.

Figure 4C:
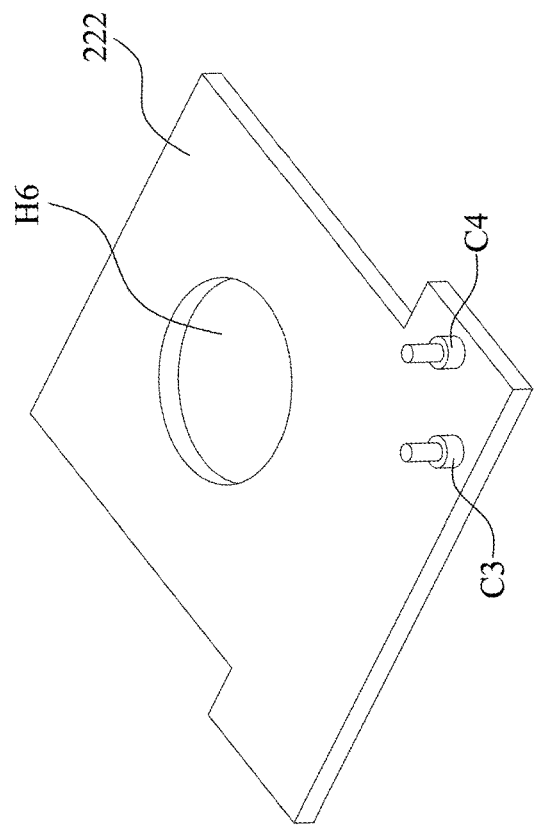
Figure 4D:
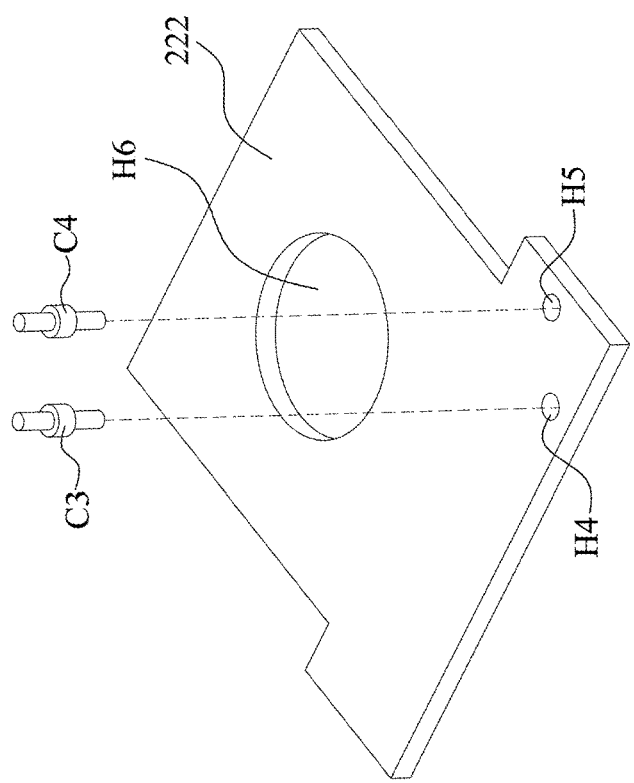

For illustration, reference is made to FIG. 4C, and the primary winding portion 220A-2 includes a carrier board 222 and conductive pillars C3-C4. The carrier board 222 includes through-holes H4-H6 arranged thereon. The conductive pillars C3-C4 are arranged in the through-holes H4-H5, respectively. The assembled primary winding portion 220A-2 is shown in FIG. 4D. In some embodiments, the arrangements of the conductive pillars C3-C4 and the carrier board 222 are similar to the arrangements of the carrier board 221 and the conductive pillars C1-C2, and thus the repetitious description is not further given hereafter.

In some embodiments, one or more planar windings (not shown) are arranged on the carrier board 222. In some embodiments, the one or more planar windings of the carrier board 222 encircle the through-hole H6 and are coupled to the conductive pillars C3-C4, in order to form a portion of the primary winding 122 in FIG. 1. In some embodiments, both of the primary winding portion 220A-1 and the primary winding portion 220A-2 correspond to the primary winding 122 in FIG. 1.

With continued reference to FIG. 3, in operation S330, the converter 270, the primary winding portion 220A-1 and a secondary winding portion 220B-1 of the transformer 220, an inductor input portion 230A of the inductor 230, an inductor output portion 240B of the inductor 240, the rectifying unit 250-1, and the conductive sheet 260 are arranged on the first side S1 of the carrier board 201.

For illustration, reference is made to FIG. 4E, and the converter 270 includes switches corresponding to the switches M1-M4 of FIG. 1, respectively. The carrier board 201 includes through-holes H7-H17 arranged thereon, and these through-holes H7-H17 penetrate through the first side S1 and the second side S2 of the carrier board 201. The through holes H7-H8 are arranged corresponding to the through-holes H1-H2 of the primary winding portion 220A-1, and the through-hole H9 is arranged corresponding to the through-hole H3 of the primary winding portion 220A-1. As a result, the conductive pillars C1-C2 of the primary winding portion 220A-1 are arranged in the through-holes H7-H8, in order to be coupled to an output terminal of the converter 270 and the primary winding portion 220A-2, respectively. In other words, the primary winding portion 220A-1 is able to be coupled to the primary winding portion 220A-2 via one of the conductive pillars C1-C2.

Furthermore, as shown in FIG. 4E, the secondary winding portion 220B-1 and the inductor input portion 230A are implemented with a conductive plate 401. In some embodiments, the secondary winding portion 220B-1, the inductor input portion 230A, and the conductive plate 401 are integrally formed or one-piece formed. In some embodiments, if two components are referred to as being "integrally formed," these components may be connected together to work as a single unit. In some embodiments, if two components are referred to as being "one-piece formed", these components may be formed with the same material and made from a single structure.

Figure 4F:
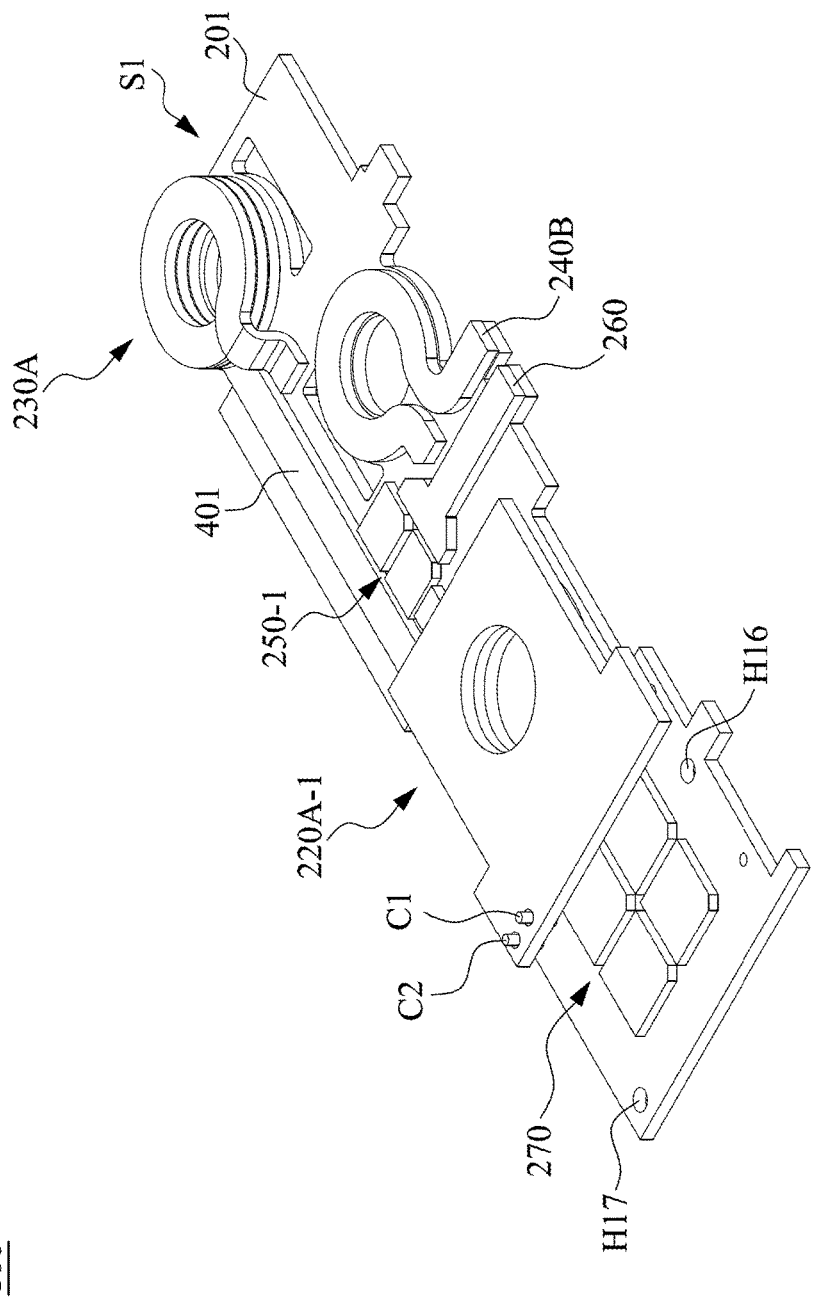
Figure 4G:
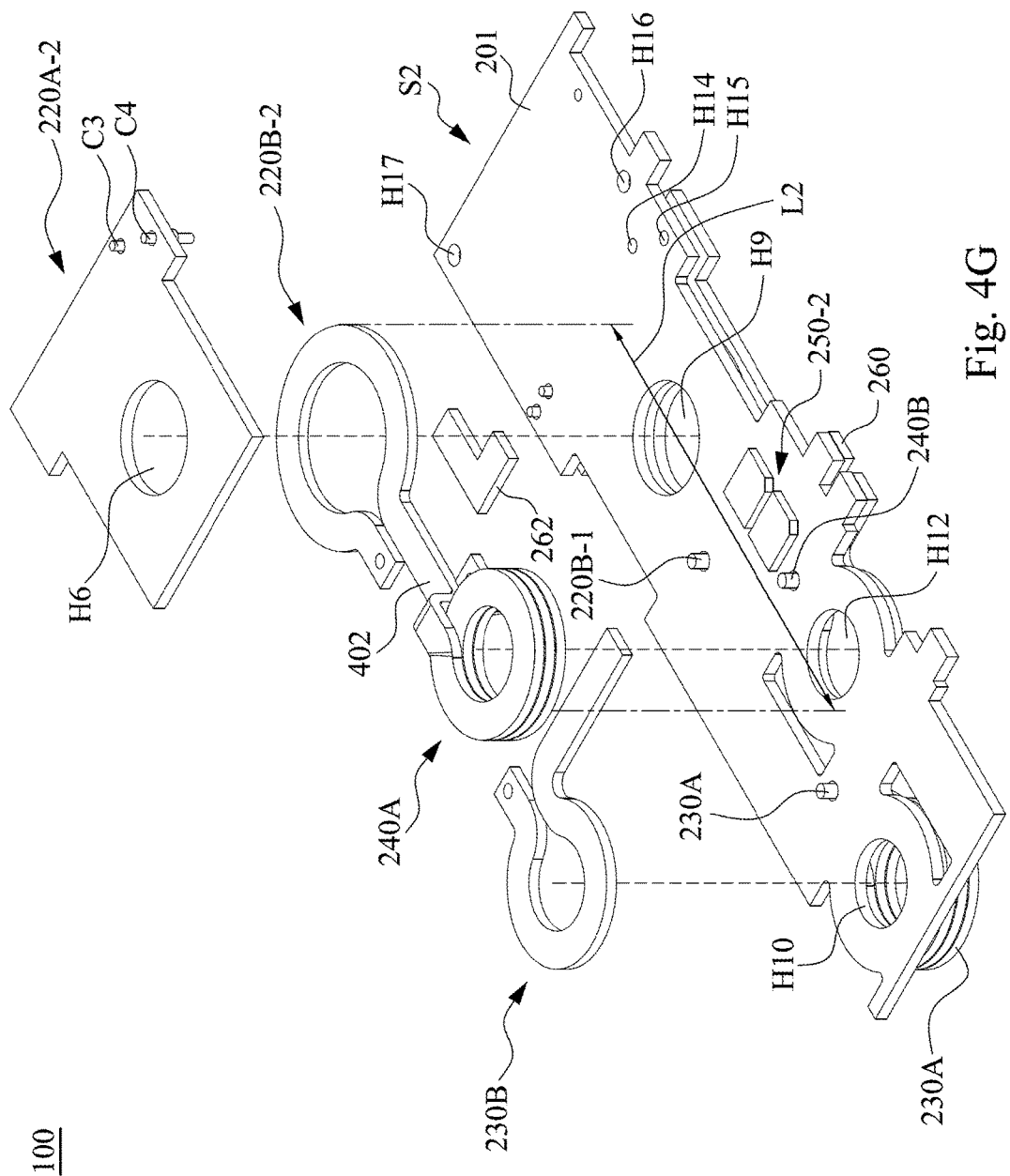

The secondary winding portion 220B-1 is arranged to encircle the through-hole H9 and between the first side S1 of the carrier board 201 and the primary winding portion 220A-1. The secondary winding portion 220B-1 corresponds to the secondary winding 124 in FIG. 1. The secondary winding portion 220B-1 is coupled to the rectifying unit 250-1 via one or more conductive paths (not shown) on the carrier board 201 and is coupled to the inductor input portion 230A via the conductive plate 401. The secondary winding portion 220B-1 has a structure of conductive pillar that can be arranged corresponding to the through-hole H22. As a result, the secondary winding portion 220B-1 is extended from the through-hole H22 to the second side S2 of the carrier board 201, as shown in FIG. 4G, in order to be coupled to a secondary winding portion 220B-2.

The inductor input portion 230A is extended from the conductive plate 401 and encircles the through-hole H10. In this embodiment, a number of turns in the inductor input portion 230A is 3, but the present disclosure is not limited thereto. An end terminal of the inductor input portion 230A has a structure of conductive pillar that can be arranged in the through-hole H11. As a result, the inductor input portion 230A is extended to the second side S2 of the carrier board 201, as shown in FIG. 4G.

The inductor output portion 240B may also be implemented with a conductive plate. The inductor output portion 240B encircles the through-hole H12. An end terminal of the inductor output portion 240B has a structure of conductive pillar that can be arranged in the through-hole H13. As a result, the inductor output portion 240B is able to be extended to the second side S2 of the carrier board 201, as shown in FIG. 4G. In this embodiment, a number of turns in the inductor output portion 240B is 1, but the present disclosure is not limited thereto.

The rectifying unit 250-1 is arranged on the first side S1 of the carrier board 201, and is coupled to the inductor input portion 230A and the secondary winding portion 220B-1 via a one or more conductive paths (not shown) on the carrier board 201. The conductive sheet 260 is arranged on the first side S1 of the carrier board 201, and is coupled to the rectifying unit 250-1 via one or more conductive paths (not shown) on the carrier board 201. In some embodiments, the conductive sheet 260 is arranged to provide a discharging path for the rectifying unit 250-1. For example, if the power converter module 100 is installed to a power supply, the conductive sheet 260 will be coupled to ground. As a result, the rectifying unit 250-1 is able to be coupled to ground via the conductive sheet 260 for discharging. The components assembled in operation S330 are shown in FIG. 4F.

With continued reference to FIG. 3, in operation S340, the primary winding portion 220A-2 and the secondary winding portion 220B-2 of the transformer 220, an inductor output portion 230B of the inductor 230, an inductor input portion 240A of the inductor 240, the rectifying unit 250-2, and the conductive sheet 262 are arranged on the second side S2 of the carrier board 201.

For illustration, reference is made to FIG. 4G, through-hole H14-H15 of the carrier board 201 are arranged corresponding to the through-holes H4-H5 of the primary winding portion 220A-2, and the through-hole H9 is arranged corresponding to the through-hole H6 of the primary winding portion 220A-2. As a result, the conductive pillars C3-C4 of the primary winding portion 220A-2 are able to be arranged in the through-holes H14-H15, in order to be coupled to another output terminal of the converter 270 and the primary winding portion 220A-1 respectively. In other words, the primary winding portion 220A-2 is able to be coupled to the primary winding portion 220A-1 via one of the conductive pillars C3-C4.

Furthermore, as shown in FIG. 4G, the secondary winding portion 220B-2 and the inductor input portion 240A are implemented with a conductive plate 402. In some embodiments, the secondary winding portion 220B-2, the inductor input portion 240A and the conductive plate 402 are integrally formed or one-piece formed.

In some embodiments, a vertical projection of both of the inductor input portion 230A and the secondary winding portion 220B-1 in FIG. 4E on the first side S1 of the carrier board 201 has a length L1, and a vertical projection of both of the inductor input portion 240A and the secondary winding portion 220B-2 in FIG. 4G on the second side S2 of the carrier board 201 has a length L2, and the length L1 is longer than the length L2. With the above arrangement, multiple circuit components (which include, for example, the transformer 120 and the inductors 130 and 132 in FIG. 1) can be integrated on the two corresponding sides of the carrier board 201 while a thickness of the power converter module 100 is reduced.

The secondary winding portion 220B-2 is arranged to encircle the through-hole H9, and is arranged between the second side S2 of the carrier board 201 and the primary winding portion 220A-2. The secondary winding portion 220B-2 and the secondary winding portion 220B-1 of FIG. 4E correspond to the secondary winding 124 of FIG. 1. The secondary winding portion 220B-2 is coupled to the rectifying unit 250-2 via one or more conductive paths (not shown) on the carrier board 201, and is coupled to the inductor input portion 240A via the conductive plate 402. An end terminal of the secondary winding portion 220B-2 has a structure of through-hole that can be assembled with the structure of conductive pillar of the end terminal of the secondary winding portion 220B-1. As a result, the secondary winding portion 220B-1 is able to be coupled to the secondary winding portion 220B-2, in order to operate as a secondary winding (e.g., the secondary winding 124 in FIG. 1) equivalently.

The inductor input portion 240A is extended from the conductive plate 402 and encircles the through-hole H12. In other words, the inductor input portion 240A is arranged on the second side S2 of the carrier board 201 and arranged corresponding to the inductor output portion 240B. In this embodiment, a number of turns in the inductor input portion 240A is 3, but the present disclosure is not limited thereto. An end terminal of the inductor input portion 240A has a structure of through-hole that can be assembled with the structure of conductive pillar of the end terminal of the inductor output portion 240B. As a result, the inductor input portion 240A is able to be coupled to the inductor output portion 240B, in order to operate as a single inductor (e.g., the inductor 132 in FIG. 1) equivalently.

The inductor output portion 230B is also implemented with a conductive plate. The inductor output portion 230B encircles the through-hole H10. An end terminal of the inductor output portion 230B has a structure of through-hole that can be assembled with the structure of conductive pillar of the end terminal of the inductor input portion 230A. As a result, the inductor input portion 230A is able to be coupled to the inductor output portion 230B, in order to operate as a single inductor (e.g., the inductor 130 in FIG. 1) equivalently. In this embodiment, a number of turns in the inductor output portion 230B is 1, but the present disclosure is not limited thereto.

The rectifying unit 250-2 is arranged on the second side S2 of the carrier board 201, and is coupled to the inductor input portion 240A and the secondary winding portion 220B-2 via one or more conductive paths (not shown) on the carrier board 201. The conductive sheet 262 is arranged on the second side S2 of the carrier board 201 and arranged corresponding to the conductive sheet 260, and is coupled to the rectifying unit 250-2 via one or more conductive paths (not shown) on the carrier board 201.

Figure 4H:
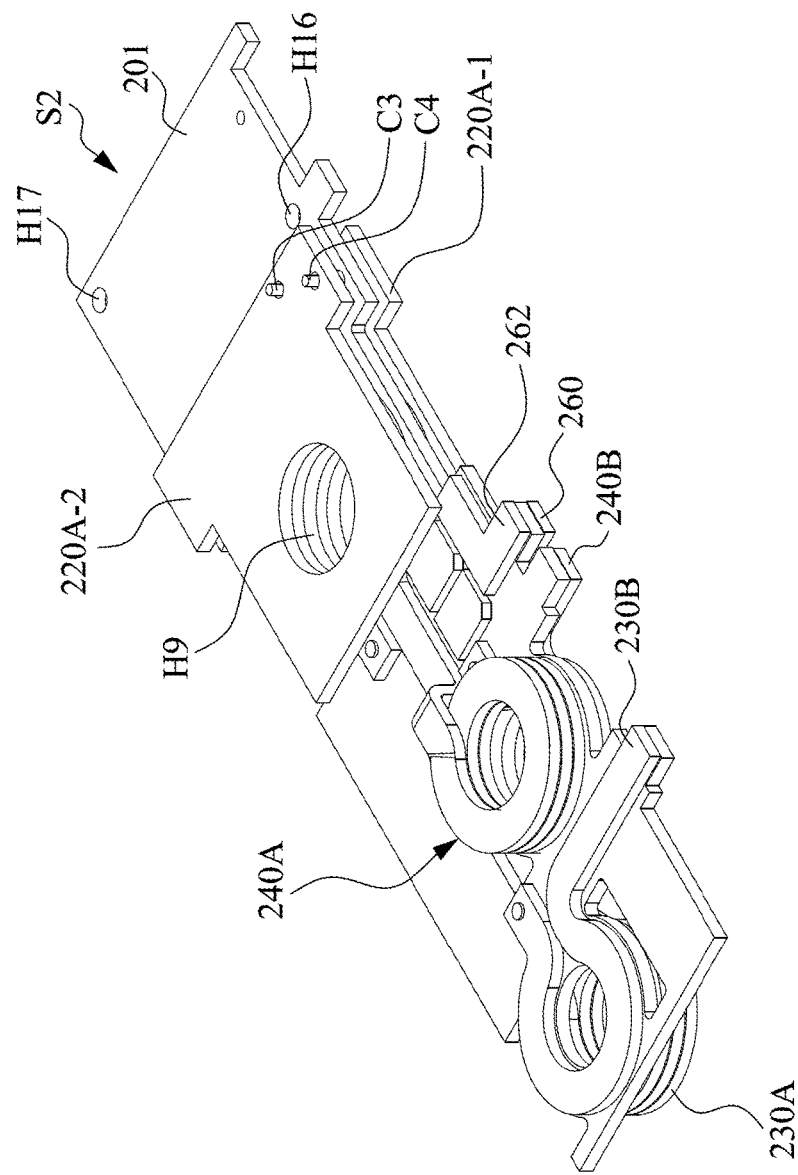

The components assembled in operation S340 are shown in FIG. 4H. As shown in FIG. 4H, the conductive sheet 260 and the conductive sheet 262 are extended outwardly from the carrier board 201, in order to be suitable for connecting with a power supply or other electronic devices. In some embodiments, if the power converter module 100 is installed to a power supply, extending portions of the conductive sheet 260 and the conductive sheet 262 are coupled to ground, in order to provide discharging paths for the rectifying unit 250-1 and the rectifying unit 250-2 respectively.

In this example, the conductive sheet 262 and the conductive sheet 260 have different shapes, but the present disclosure is not limited thereto. Various shapes suitable for connecting to the power converter module are within the contemplated scope of the present disclosure.

With continued reference to FIG. 3, in operation S350, a magnetic core set of the transformer 220, a magnetic core set of the inductor 230, and a magnetic core set of the inductor 240 are arranged on the carrier board 201.

Figure 4I:
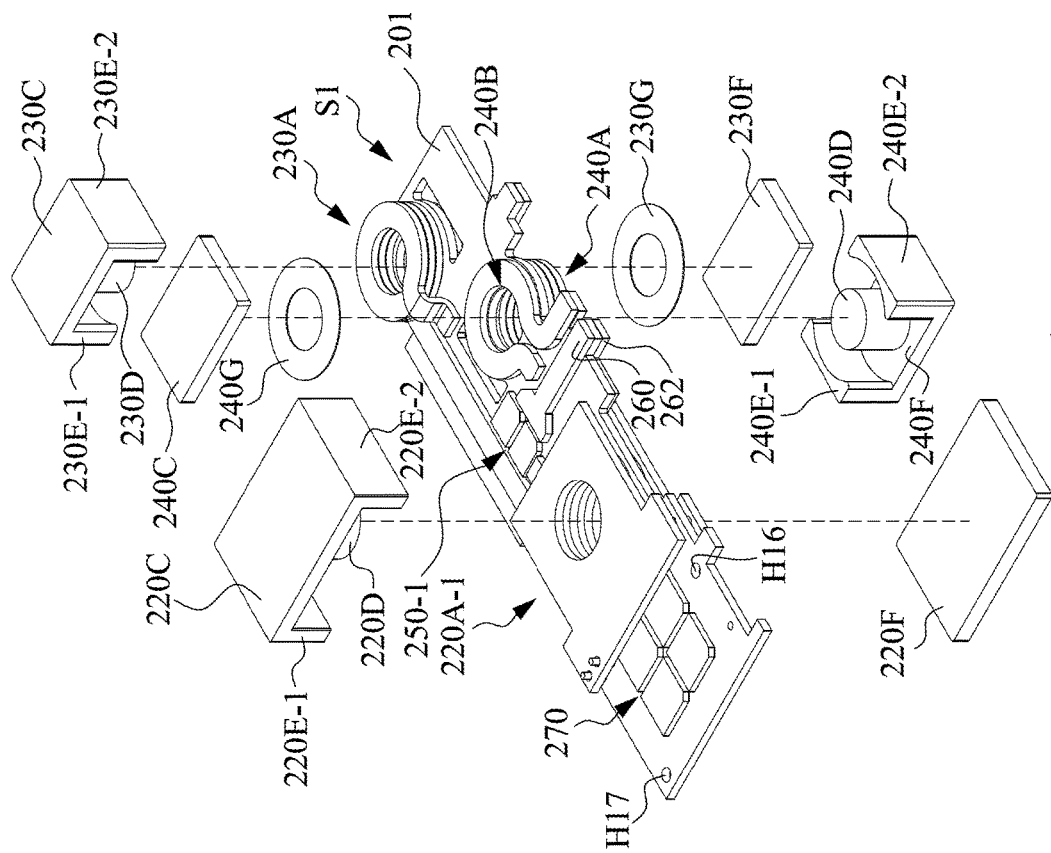

For illustration, reference is made to FIG. 4I, and the magnetic core set of the transformer 220 includes a magnetic core cover plate 220C, a magnetic core column 220D, side columns 220E-1 and 220E-2, and a magnetic core cover plate 220F. The magnetic core column 220D and the side columns 220E-1 and 220E-2 formed on the magnetic core cover plate 220C. The magnetic core cover plate 220C is arranged on the first side S1 of the carrier board 201, and is located on the primary winding portion 220A-1. The magnetic core column 220D is arranged corresponding to the through-hole H3 (not labeled) of the primary winding portion 220A-1, in order to arrange the primary winding portion 220A-1, the primary winding portion 220A-2, the secondary winding portion 220B-1, and the secondary winding portion 220B-2 to be around the magnetic core column 220D. The magnetic core cover plate 220F is arranged on the second side S2 (not labeled) of the carrier board 201 and arranged corresponding to the magnetic core cover plate 220C, and is located on the primary winding portion 220A-2 (not labeled). With the above arrangement, the magnetic core set of the transformer 220 equivalently forms an E-I type magnetic core.

The magnetic core set of the inductor 230 includes a magnetic core cover plate 230C, a magnetic core column 230D, side columns 230E-1 and 230E-2, a magnetic core cover plate 230F, and a membrane 230G. The magnetic core column 230D, and side columns 230E-1 and 230E-2 are formed on the magnetic core cover plate 230C. The magnetic core cover plate 230C is arranged on the first side S1 of the carrier board 201 and is located on the inductor input portion 230A. The magnetic core column 230D is arranged corresponding to the through-hole H10 (not labeled), in order to arrange the inductor input portion 230A and the inductor output portion 230B to be around the magnetic core column 230D. The magnetic core cover plate 230F is arranged on the second side S2 (not labeled) of the carrier board 201 and arranged corresponding to the magnetic core cover plate 230C, and is located on the inductor output portion 230B. The membrane 230G encircles the magnetic core column 230D, and is located between the inductor output portion 230B and the magnetic core cover plate 230F. With the above arrangement, the magnetic core set of the inductor 230 equivalently forms an E-I type magnetic core.

Figure 4J:
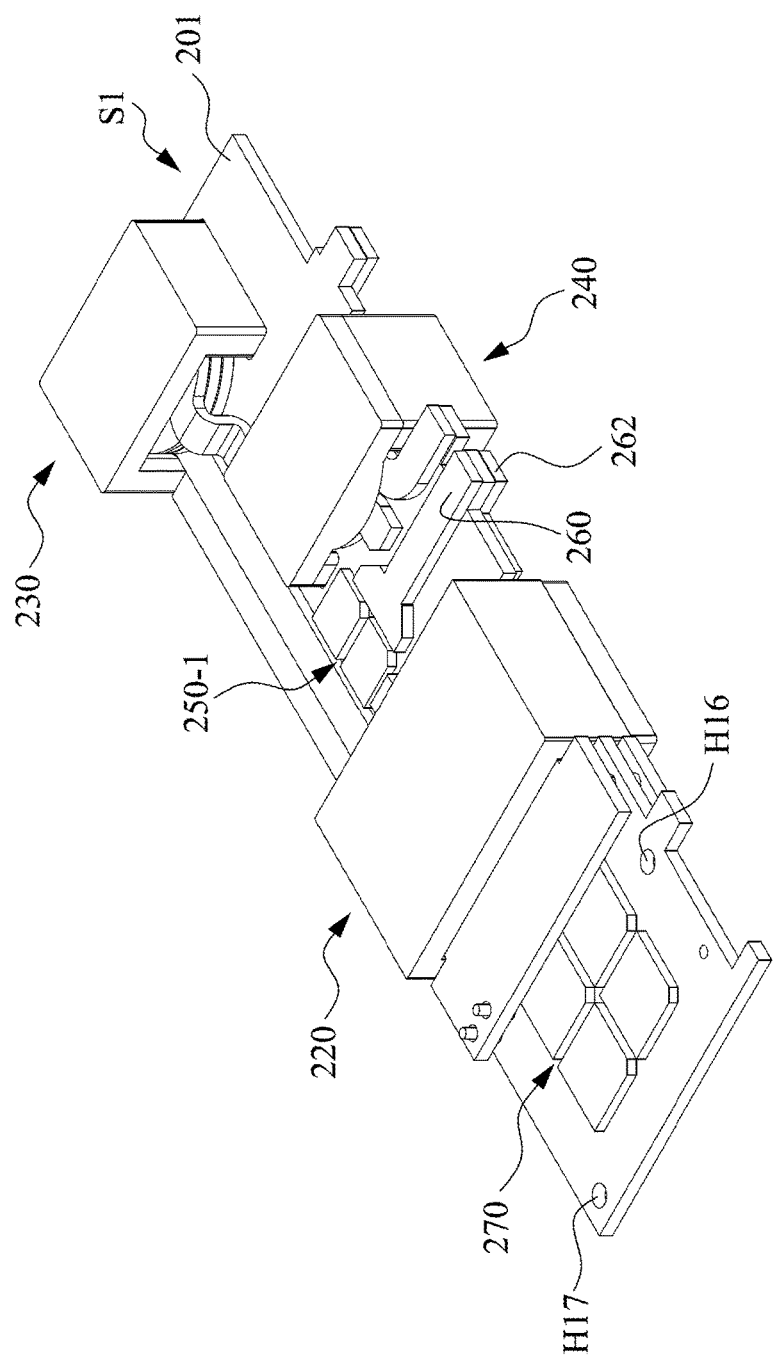

The magnetic core set of the inductor 240 includes magnetic core cover plate 240C, the magnetic core column 240D, side columns 240E-1 and 240E-2, the magnetic core cover plate 240F and the membrane 240G. The magnetic core cover plate 240C is arranged on the first side S1 of the carrier board 201, and is located on the inductor output portion 240B. The magnetic core column 240D and the side columns 240E-1 and 240E-2 are formed on the magnetic core cover plate 240F. The magnetic core column 240D is arranged corresponding to the through-hole H12 (not labeled), in order to arrange the inductor input portion 240A and the inductor output portion 240B to be around the magnetic core column 240D. The magnetic core cover plate 240F is arranged on the second side S2 (not labeled) of the carrier board 201 and arranged corresponding to the magnetic core cover plate 240C, and is located on the inductor input portion 240A. The membrane 240G encircles the magnetic core column 240D, and is located between the inductor output portion 240B and the magnetic core cover plate 240C. With the above arrangement, the magnetic core set of the inductor 240 equivalently forms an E-I type magnetic core. The components assembled in operation S350 are shown in FIG. 4J.

The magnetic core sets of the various components given above are described with the E-I type magnetic core for illustrative purposes. Various types of magnetic cores are within the contemplated scope of the present disclosure.

With continued reference to FIG. 3, in operation S360, the heat radiator 210 is arranged on the carrier board 201. With the above operations, the power converter module 100 shown in FIG. 2A and FIG. 2B can be assembled.

Figure 4K:
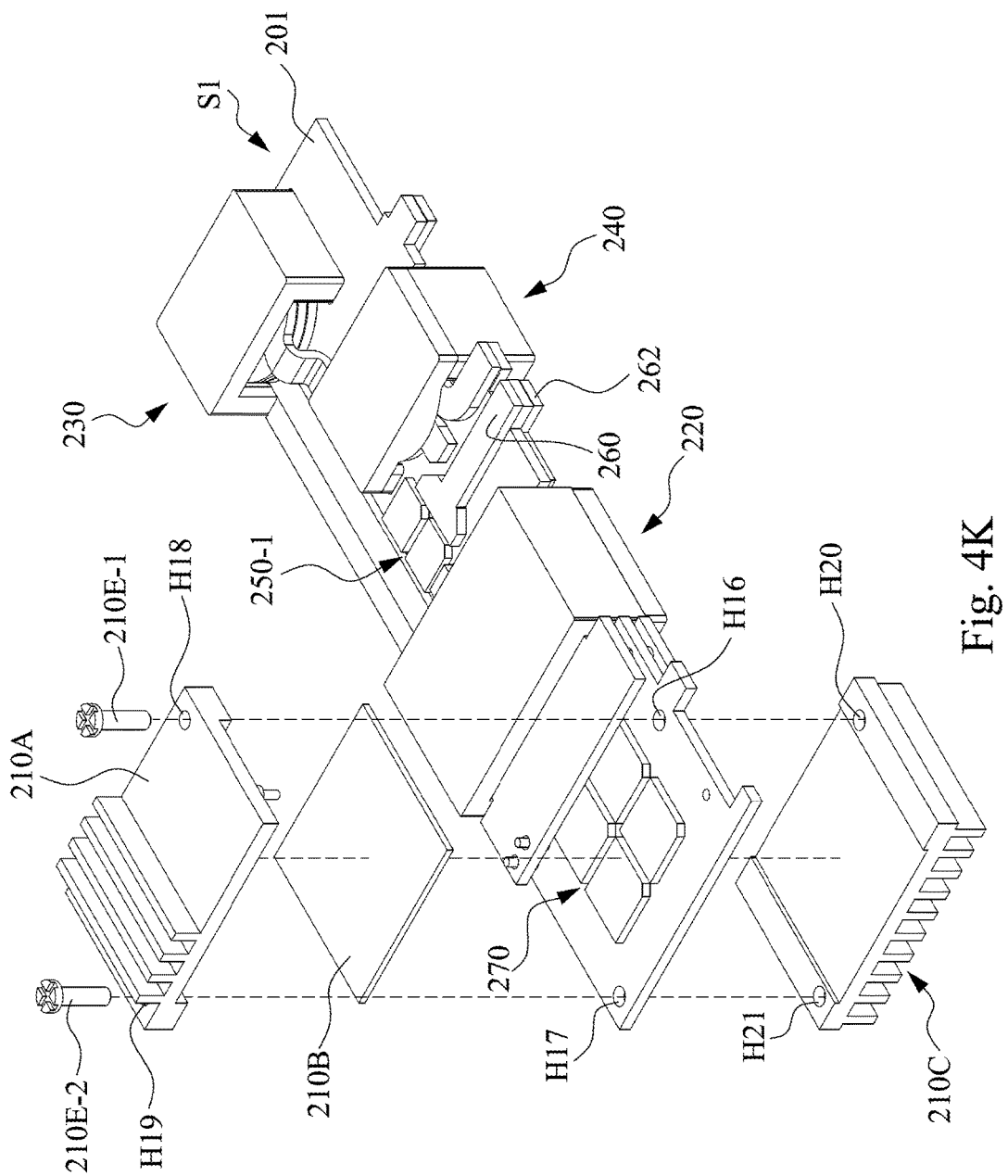

For illustration, reference is made to FIG. 4K, and the heat radiator 210 includes a heat sink 210A, a gap pad 210B, a heat sink 210C, and fixed parts 210E-1 and 210E-2. The heat sink 210A is arranged on the first side S1 of the carrier board 201, and is located on the converter 270. The gap pad 210B is arranged between the heat sink 210A and the converter 270. The heat sink 210C is arranged on the second side S2 (not shown) of the carrier board 201 and arranged corresponding to the heat sink 210A. In some embodiments, the heat sink 210A, the gap pad 210B, and the heat sink 210C are formed with materials (e.g., copper) having high thermal conductivity. The heat sink 210A and the heat sink 210C have one or more fins arranged thereon, in order to expedite heat dissipation.

The heat sink 210A includes through-holes H18-H19, and the heat sink 210C includes through holes H20-H21. The through-hole H18 is aligned with the through-hole H16 of the carrier board 201 and the through-hole H20, and the through-hole H19 is aligned with the through-holes H17 of the carrier board 201 and the through-hole H21. The fixed part 210E-1 is arranged in the through-holes H18, H16, and H20, and the fixed part 210E-2 is arranged in the through-holes H19, H17, and H21. As a result, the heat radiator 210 can be fixed on the carrier board 201. In some embodiments, the fixed parts 210E-1 and 210E-2 are screws, but the present disclosure is not limited thereto. The components assembled in operation S360 is shown in FIG. 2A.

The implementation of the heat radiator 210 is given for illustrative purposes. Various types of the heat radiator 210 are within the contemplated scope of the present disclosure.

The above descriptions of the method 300 include exemplary operations, but the operations of the method 300 are not necessarily performed in the order described above. The operations of the method 300 may be increased, replaced, omitted, or performed in different orders as appropriate, in accordance with the spirit and scope of various embodiments of the present disclosure.

Figure 5:
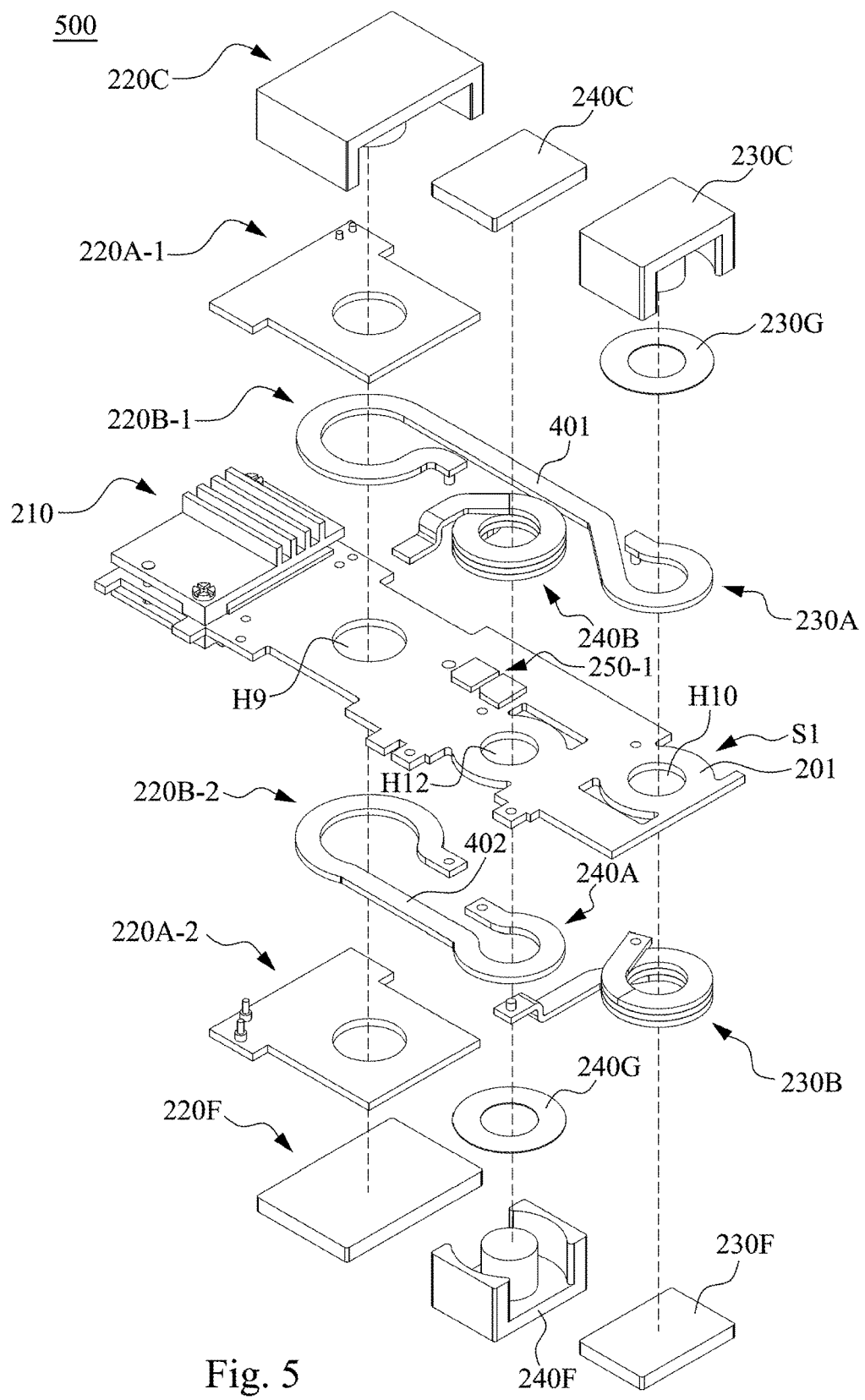
FIG. 5 is a schematic diagram illustrating a partial exploded view of a power converter module, according to some other embodiments of the present disclosure.

In the above examples, the number of turns in the inductor input portion 230A or 240A is 3, and the number of turns in the inductor output portion 230B or 240B is 1. The number of the turns in the above components may be adjusted according to practical requirements, and the present disclosure is not limited thereto. For example, reference is now made to FIG. 5. FIG. 5 is a schematic diagram illustrating a partial exploded view of a power converter module 500, according to some other embodiments of the present disclosure. For ease of understanding, like elements in FIG. 5 are designated with the same reference numbers with respect to the above figures.

For ease of understanding, as shown in FIG. 5, the structures of the transformer 220, the inductor 230, and the inductor 240 are illustrated in exploded view. As shown in FIG. 5, in the power converter module 500, the number of turns in the inductor input portion 230A is 1, and the number of turns in the inductor output portion 230B is 3. The number of turns in the inductor input portion 240A is 3, and the number of the inductor output portion 240B is 1. Arrangements of the remaining components are the same as the arrangements of the power converter module 100 described in the above embodiments, and thus the repetitious descriptions are not further given hereafter.

In addition, the conductive sheet 260 or 262 is not shown in FIG. 5 for ease of understanding. In some embodiments, the power converter module 500 may only employ the conductive sheet 260, in which the conductive sheet 260 is coupled to the rectifying unit 250-1, in order to provide a discharging path for the rectifying unit 250-1 when the power converter module 500 is installed to a power supply.

Figure 6:
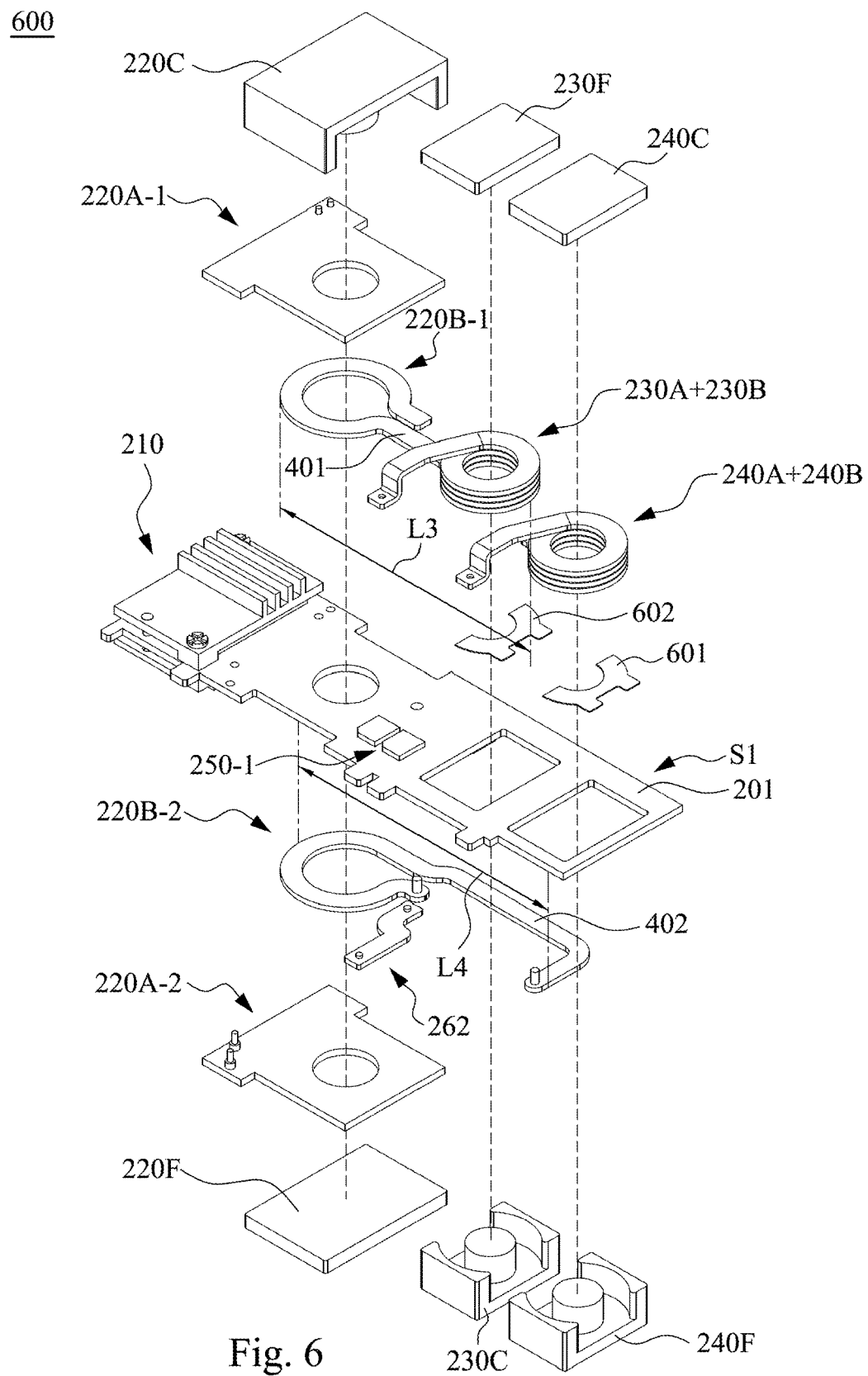
FIG. 6 is a schematic diagram illustrating a partial exploded view of a power converter module, according to some other embodiments of the present disclosure.

Reference is made to FIG. 6. FIG. 6 is a schematic diagram illustrating a partial exploded view of a power converter module 600, according to some other embodiments of the present disclosure. For ease of understanding, like elements in FIG. 6 are designated with the same reference numbers with respect to the above figures.

For ease of understanding, as shown in FIG. 6, the structures of the transformer 220, the inductor 230, and the inductor 240 are illustrated in exploded view. Compared with the above embodiments, the locations of the inductor 230 and the inductor 240 are exchanged. In other words, in this example, compared with inductor 240, the inductor 230 is closer to the transformer 220. The inductor input portion 230A and the inductor output portion 230B of the inductor 230 are integrated together and arranged on the first side S1 of the carrier board 201, in which a number of turns in the integrated inductor input portion 230A and inductor output portion 230B is 4. In other words, in this example, the number of turns of the inductor 230 at the second side S2 (not labeled) of the carrier board 201 is 0. In this example, an end terminal of the integrated inductor input portion 230A and inductor output portion 230B is connected to a pin of the carrier board 201, in order to be coupled to other components via one or more conductive paths (not shown) on the carrier board 201.

Similarly, the inductor input portion 240A and the inductor output portion 240B of the inductor 240 are integrated together, and are arranged on the first side S1 of the carrier board 201, in which a number of turns in the integrated inductor input portion 240A and inductor output portion 240B is 4. In other words, in this example, the number of turns in the inductor 240 at the second side S2 (not labeled) of the carrier board 201 is 0. In this example, a first end terminal of the integrated inductor input portion 240A and inductor output portion 240B is connected to a pin of the carrier board 201, in order to be coupled to other components via one or more conductive paths (not shown) on the carrier board 201. In addition, a second end terminal of the integrated inductor input portion 240A and inductor output portion 240B has a structure of through-hole (not shown) that can be assembled with the structure of conductive pillar of the end terminal of the conductive plate 402, in order to be coupled to the conductive plate 402.

In this example, a vertical projection of the secondary winding portion 220B-1, the conductive plate 401, and the inductor 230 on the carrier board 201 has a length L3, and a vertical projection of the secondary winding portion 220B-2, the conductive plate 402, and the inductor 240 on the carrier board 201 has a length L4, in which the length L4 is longer than the length L3. Similar to the previous embodiments, with the asymmetric arrangement in lengths, multiple components can be arranged on two sides of the single carrier board 201, in order to form the power converter module 100 in FIG. 1.

Compared with the previous embodiments, the power converter module 600 further includes stands 601 and 602. The stands 601 and 602 are arranged on the first side S1 of the carrier board 201, in order to carry the integrated inductor input portion 240A and inductor output portion 240B and the integrated inductor input portion 230A and inductor output portion 230B, respectively.

Moreover, compared with the above embodiments, in this example, the power converter module 600 may only employ the conductive sheet 262. The conductive sheet 262 is coupled to the rectifying unit 250-1 via one or more conductive paths (not shown) on the carrier board 201, in order to provide a discharging path for the rectifying unit 250-1 when the power converter module 600 is installed in a power supply.

The above embodiments are given with reference to the circuit in FIG. 1 for illustrative purposes, but the present disclosure is not limited thereto. Various power converter circuits, which can employ the same arrangements, are within the contemplated scope of the present disclosure.

The above embodiments are given with reference to examples of arranging the converter 270 on the first side S1 of the carrier board 201. In some embodiments, the converter 270 may be arranged on the second side S2. Alternatively, in yet some embodiments, a part of components of the converter 270 is arranged on the first side S1 of the carrier board 201, and remaining parts of components of the converter 270 are arranged on the second side S2 of the carrier board 201. For example, components corresponding to the switches M1 and M2 in the converter 270 may be arranged on the first side S1, and components corresponding to the switches M3 and M4 in the converter 270 may be arranged on the second side S2. Thus, various arrangements of the converter 270 are within the contemplated scope of the present disclosure.

As described above, the power converter module provided in the present disclosure is able to integrate windings of the transformer and the inductor by using an integrally formed conductive plate, such that the size of the power converter module can be reduced. Furthermore, with the asymmetric arrangement in lengths, more components are able to be integrated on two sides of the carrier board.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power converter module, comprising:
a carrier board comprising a converter and a first rectifying unit arranged thereon;
a transformer comprising:
a first primary winding portion arranged on a first side of the carrier board and coupled to a first output terminal of the converter; and
a first secondary winding portion arranged between the first side and the first primary winding portion and coupled to the first rectifying unit; and
a first inductor comprising:
a first inductor input portion arranged on the first side and coupled to the first rectifying unit, wherein the first secondary winding portion is implemented with a first conductive plate, and the first inductor input portion and the first conductive plate are integrally formed; and
a first inductor output portion coupled to the first inductor input portion and arranged on the first side of the carrier board or arranged corresponding to the first inductor input portion and on a second side of the carrier board,
wherein the carrier board comprises:
a plurality of through-holes penetrating through the first side and the second side,
wherein the first primary winding portion is coupled to the first output terminal of the converter via a first through-hole of the plurality of through-holes, and the first inductor input portion is coupled to the first inductor output portion via a second through-hole of the plurality of through-holes if the first inductor output portion is arranged on the second side.

2. The power converter module of claim 1, wherein an end terminal of the first inductor output portion comprises a structure of through-hole arranged corresponding to the second through-hole, an end terminal of the first inductor input portion comprises a structure of conductive pillar, and the structure of conductive pillar is arranged in the structure of through-hole via the second through-hole, in order to be coupled to the first inductor output portion.

3. A power converter module, comprising:
a carrier board comprising a converter and a first rectifying unit arranged thereon;
a transformer comprising:
a first primary winding portion arranged on a first side of the carrier board and coupled to a first output terminal of the converter; and
a first secondary winding portion arranged between the first side and the first primary winding portion and coupled to the first rectifying unit; and
a first inductor comprising:
a first inductor input portion arranged on the first side and coupled to the first rectifying unit, wherein the first secondary winding portion is implemented with a first conductive plate, and the first inductor input portion and the first conductive plate are integrally formed; and
a first inductor output portion coupled to the first inductor input portion and arranged on the first side of the carrier board or arranged corresponding to the first inductor input portion and on a second side of the carrier board, wherein the first inductor further comprises:
a first magnetic core cover plate arranged on the first side and located on the first inductor input portion;
a magnetic core column formed on the first magnetic core cover plate;
a plurality of side columns formed on two sides of the first magnetic core cover plate;
a second magnetic core cover plate arranged corresponding to the first magnetic core cover plate and on the second side and located on the first inductor output portion, wherein the first inductor input portion and the first inductor output portion are arranged to be around the magnetic core column; and
a membrane arranged between the second magnetic core cover plate and the first inductor output portion.

4. A power converter module, comprising:
a carrier board comprising a converter and a first rectifying unit arranged thereon;
a transformer comprising:
a first primary winding portion arranged on a first side of the carrier board and coupled to a first output terminal of the converter; and
a first secondary winding portion arranged between the first side and the first primary winding portion and coupled to the first rectifying unit; and
a first inductor comprising:
a first inductor input portion arranged on the first side and coupled to the first rectifying unit, wherein the first secondary winding portion is implemented with a first conductive plate, and the first inductor input portion and the first conductive plate are integrally formed; and
a first inductor output portion coupled to the first inductor input portion and arranged on the first side of the carrier board or arranged corresponding to the first inductor input portion and on a second side of the carrier board, wherein a second rectifying unit is arranged on the second side of the carrier board, and the transformer further comprises:
a second primary winding portion arranged corresponding to the first primary winding portion and on the second side and coupled to the first primary winding portion and a second output terminal of the converter; and
a second secondary winding portion arranged between the second side and the second primary winding portion and coupled to the first secondary winding portion and the second rectifying unit.

5. The power converter module of claim 4, wherein the carrier board comprises a plurality of through-holes penetrating through the first side and the second side,
wherein the second primary winding portion is coupled to the first primary winding portion via a first through-hole of the plurality of through-holes and is coupled to the second output terminal of the converter via a second through-hole of the plurality of through-holes, and the second secondary winding portion is coupled to the first secondary winding portion via a third through-hole of the plurality of through-holes.

6. The power converter module of claim 5, wherein the transformer further comprises at least one conductive pillar arranged in the first through-hole, in order to couple the first primary winding portion to the second primary winding portion.

7. The power converter module of claim 5, wherein an end terminal of the second secondary winding portion comprises a structure of through-hole arranged corresponding to the third through-hole, an end terminal of the first secondary winding portion comprises a structure of conductive pillar, and the structure of conductive pillar is arranged in the structure of through-hole, in order to be coupled to the second secondary winding portion.

8. The power converter module of claim 4, wherein the transformer further comprises:
 a first magnetic core cover plate arranged on the first side and located on the first primary winding portion;
 a magnetic core column formed on the first magnetic core cover plate;
 a plurality of side columns formed on two sides of the first magnetic core cover plate; and
 a second magnetic core cover plate arranged corresponding to the first magnetic core cover plate and on the second side and located on the second primary winding portion, wherein the first secondary winding portion and the second secondary winding portion are arranged to be around the magnetic core column.

9. The power converter module of claim 4, further comprising a second inductor, and the second inductor comprising:
 a second inductor input portion coupled to the second rectifying unit, wherein the second secondary winding portion is implemented with a second conductive plate, and the second inductor input portion is coupled to the second conductive plate; and
 a second inductor output portion coupled to the second inductor input portion.

10. The power converter module of claim 9, wherein the carrier board comprises a through-hole penetrating through the first side and the second side, and the second inductor input portion is coupled to the second inductor output portion via the through-hole.

11. The power converter module of claim 10, wherein the second inductor input portion comprises a structure of through-hole arranged corresponding to the through-hole, the second inductor output portion comprises a structure of conductive pillar, and the structure of conductive pillar is arranged in the structure of through-hole via the through-hole, in order to be coupled to the second inductor input portion.

12. The power converter module of claim 9, wherein the second inductor input portion is arranged on the second side, the second inductor input portion and the second conductive plate are integrally formed, and the second inductor output portion is arranged corresponding to the second inductor input portion and on the first side.

13. The power converter module of claim 9, wherein a vertical projection of the first inductor input portion and the first secondary winding portion on the carrier board has a first length, a vertical projection of the second inductor input portion and the second secondary winding portion on the carrier board has a second length, and the first length is different from the second length.

14. The power converter module of claim 9, wherein the second inductor input portion and the second inductor output portion are arranged on the first side.

15. The power converter module of claim 14, wherein if the first inductor output portion is arranged on the first side, a vertical projection of the first inductor and the first secondary winding portion on the carrier board has a first length, a vertical projection of the second secondary winding portion, the second conductive plate, and the second inductor on the carrier board has a second length, and the first length is different from the second length.

16. The power converter module of claim 15, further comprising:
 a plurality of stands arranged on the first side and configured to carry the first inductor and the second inductor.

17. The power converter module of claim 1, further comprising:
 a conductive sheet coupled to the first rectifying unit and configured to provide a discharging path for the first rectifying unit.

18. The power converter module of claim 1, further comprising:
 a first heat sink arranged on the converter;
 a gap pad arranged between the converter and the first heat sink; and
 a second heat sink located on the second side and arranged corresponding to the converter.

* * * * *